United States Patent
Jeon (10) Patent No.: US 10,218,039 B2
(45) Date of Patent: Feb. 26, 2019

(54) METHOD AND APPARATUS FOR DETECTING STATE OF SAFETY PLUG

(71) Applicant: Samsung Electronics Co., Ltd., Suwon-si (KR)

(72) Inventor: Jinyong Jeon, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 602 days.

(21) Appl. No.: 14/589,649

(22) Filed: Jan. 5, 2015

(65) Prior Publication Data
US 2015/0309118 A1   Oct. 29, 2015

(30) Foreign Application Priority Data

Apr. 23, 2014 (KR) .................. 10-2014-0048622

(51) Int. Cl.
| | | |
|---|---|---|
| *H01M 2/34* | (2006.01) | |
| *H01M 10/48* | (2006.01) | |
| *G01R 31/36* | (2006.01) | |
| *B60L 3/04* | (2006.01) | |
| *B60L 3/00* | (2006.01) | |
| *G01R 31/327* | (2006.01) | |
| *G01R 31/00* | (2006.01) | |

(52) U.S. Cl.
CPC ......... *H01M 10/482* (2013.01); *B60L 3/0046* (2013.01); *B60L 3/04* (2013.01); *G01R 31/3277* (2013.01); *G01R 31/3658* (2013.01); *H01M 2/34* (2013.01); *G01R 31/006* (2013.01); *H01M 2200/00* (2013.01); *Y02T 10/7005* (2013.01)

(58) Field of Classification Search
CPC ...... H01M 10/48; H01M 10/482; H01M 2/34; G01R 31/327; G01R 31/3277; G01R 31/006; B60L 3/04; B60L 3/0046; B60L 11/1864; B60L 3/0069; Y02T 10/7005; H01H 2085/025; H01H 85/58; H01R 13/443; H02J 7/0021; H02J 7/0026; H02J 7/0031; H02J 7/0036
See application file for complete search history.

(56) References Cited

U.S. PATENT DOCUMENTS

| | | | | |
|---|---|---|---|---|
| 8,054,043 B2 * | 11/2011 | Yano | .................. | B60L 11/1861 320/118 |
| 8,368,350 B2 * | 2/2013 | Iwanaga | ............... | B60W 20/13 320/109 |
| 8,890,536 B2 * | 11/2014 | Park | ...................... | H01M 2/206 320/116 |

(Continued)

FOREIGN PATENT DOCUMENTS

| | | |
|---|---|---|
| JP | 5-5641 U | 1/1993 |
| JP | 2799853 B2 | 9/1998 |
| JP | 3872476 B2 | 1/2007 |

(Continued)

*Primary Examiner* — Ryan Johnson
(74) *Attorney, Agent, or Firm* — NSIP Law (57) ABSTRACT

Provided is a method and apparatus for detecting a state of a safety plug. The apparatus includes a safety plug configured to switch a connection between battery modules. The apparatus also includes a voltage output unit configured to apply a test voltage to distribution elements operatively connected to the safety plug, and output a voltage varying based on a state of the safety plug.

18 Claims, 8 Drawing Sheets

(56) References Cited

U.S. PATENT DOCUMENTS

| | | | | |
|---|---|---|---|---|
| 9,397,507 B2* | 7/2016 | Mercier | ................. | H02J 1/102 |
| 2014/0176034 A1* | 6/2014 | Matsumura | ............ | B60L 3/003 |
| | | | | 318/430 |

FOREIGN PATENT DOCUMENTS

| | | | | |
|---|---|---|---|---|
| JP | 4199578 B2 | 12/2008 | | |
| JP | 2013-31329 A | 2/2013 | | |
| JP | 5219653 B2 | 6/2013 | | |
| KR | 10-2010-0064323 A | 6/2010 | | |
| KR | 20110021396 A * | 3/2011 | ............ | H01M 2/206 |
| KR | 10-2012-0002419 A | 1/2012 | | |
| KR | 10-2013-0042129 A | 4/2013 | | |
| KR | 20130042129 A * | 4/2013 | | |
| KR | 10-1266568 B1 | 5/2013 | | |
| WO | WO 2013018209 A1 * | 2/2013 | ............. | B60L 3/003 |

* cited by examiner

METHOD AND APPARATUS FOR DETECTING STATE OF SAFETY PLUG

CROSS-REFERENCE TO RELATED APPLICATION(S)

This application claims the benefit under 35 USC 119(a) of Korean Patent Application No. 10-2014-0048622, filed on Apr. 23, 2014, in the Korean Intellectual Property Office, the entire disclosure of which is incorporated herein by reference for all purposes.

BACKGROUND

1. Field

The following description relates to a method and apparatus for detecting a state of a safety plug.

2. Description of Related Art

Designed and built to target environmental concerns and energy resources issues, an electric vehicle has become a vehicle of the future. The electric vehicle has a main power source as a battery formed as a single pack including a plurality of rechargeable and dischargeable secondary cells. Thus, the electric vehicle does not emit an exhaust and produces less noise.

In the electric vehicle, the battery may also function as a fuel tank and an engine of a gasoline powered vehicle. Thus, to enhance a safety of a user of the electric vehicle, a state or condition of the battery may be necessary to be verified.

Recently, research is being conducted to enhance the safety of the user by accurately detecting the state or the condition of the battery.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In accordance with an illustrative example, there is provide an apparatus to detect a state of a safety plug, the apparatus including a safety plug configured to switch a connection between battery modules; and a voltage output unit configured to apply a test voltage to distribution elements operatively connected to the safety plug, and output a voltage varying based on a state of the safety plug.

The voltage output unit may include a test voltage supply unit configured to supply the test voltage to the distribution elements.

The test voltage supply unit may be configured to use a voltage regulator to adjust the test voltage to be in a voltage range.

The test voltage may be input to a battery control device used to control the battery modules.

The distribution elements may include a first resistor, a second resistor, and a third resistor.

The first resistor, the second resistor, and the third resistor may be operatively connected in series, and the safety plug may be connected between the second resistor and the third resistor.

When the safety plug is in an "on" state, in which the safety plug is connected between the battery modules, the second resistor may be connected to the third resistor in series, and the voltage output unit may be configured to output a voltage across the second resistor and the third resistor as a function of the test voltage.

When the safety plug is in an "off" state, in which the safety plug is disconnected between the battery modules, a connection between the second resistor and the third resistor may be switched off, and the voltage output unit is configured to output the test voltage.

When the safety plug is shorted to an external power supply, the second resistor may be connected to the external power source, and the voltage output unit may be configured to output, as a function of the test voltage, a voltage applied to both ends of the second resistor and a voltage supplied to the external power source.

When the safety plug is shorted to a ground, the second resistor may be connected to the ground, and the voltage output unit may be configured to output a voltage applied to both ends of the second resistor as a function of the test voltage.

The voltage output unit may be configured to output a voltage detected between the first resistor and the second resistor.

In accordance with another illustrative example, there is provide a battery control apparatus, including: a voltage receiver configured to receive a voltage varying based on a state of a safety plug switching a connection between battery modules; and a condition detector configured to detect the state of the safety plug based on the received voltage.

The condition detector may be configured to detect the state of the safety plug by comparing the received voltage to reference information, and the reference information may include information on the state to which the received voltage is mapped.

The battery control apparatus may also include a battery module controller configured to control the battery modules based on the detected state of the safety plug.

In accordance with an illustrative example, there is provide a battery, including: battery modules; a safety plug configured to switch a connection between the battery modules; a voltage output unit configured to apply a test voltage to distribution elements operatively connected to the safety plug, and output a voltage varying based on a state of the safety plug; and a controller configured to detect the state of the safety plug based on the voltage output from the voltage output unit.

The distribution elements may include a first resistor, a second resistor, and a third resistor. The first resistor, the second resistor, and the third resistor may be connected in series, and the safety plug may be connected between the second resistor and the third resistor.

The voltage output unit may be configured to provide, to the controller, a voltage detected between the first resistor and the second resistor.

The controller may be configured to control the battery modules based on the detected state of the safety plug. The voltage output unit may include a test voltage supply unit configured to supply the test voltage to the distribution elements.

The safety plug may be configured to prevent the battery modules from supplying an amount of current in excess of a device operating threshold, wherein the device may include at least one of an automobile, a mobile device, and a display.

Other features and aspects will be apparent from the following detailed description, the drawings, and the claims.

BRIEF DESCRIPTION OF THE DRAWINGS

These and/or other aspects will become apparent and more readily appreciated from the following description of the embodiments, taken in conjunction with the accompanying drawings in which.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "include" and/or "have," when used in this specification, specify the presence of stated features, integers, steps, operations, elements, components or combinations thereof, but do not preclude the presence or addition of one or more other features, integers, steps, operations, elements, components, and/or groups thereof.

Unless otherwise defined, all terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will also be understood that when an element or layer is referred to as being "on" or "connected to" or "operatively connected" to another element or layer, it can be directly on or connected to the other element or layer or through intervening elements or layers may be present. In contrast, when an element is referred to as being "directly on" or "directly connected to" another element or layer, there are no intervening elements or layers present.

Like reference numerals in the drawings denote like elements, and redundant descriptions of like elements will be omitted herein. When it is determined a detailed description of a related known function or configuration they may make the purpose of the present invention unnecessarily ambiguous in describing the present invention, the detailed description will be omitted herein.

Figure 1:
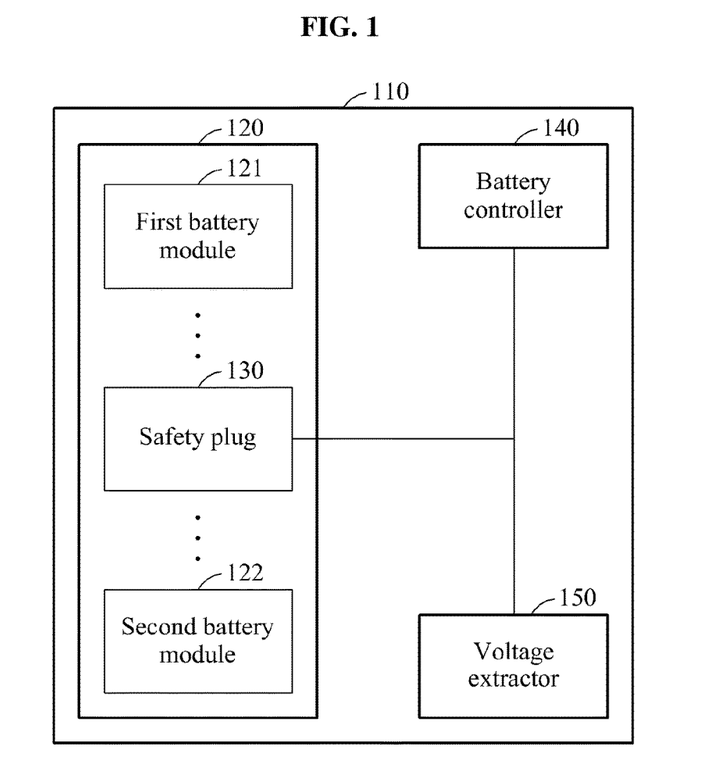
FIG. 1 is a block diagram illustrating an example of a battery, in accordance with an embodiment.

FIG. 1 is a block diagram illustrating an example of a battery 110, in accordance with an embodiment.

Referring to FIG. 1, the battery 110 includes a battery pack 120, a battery controller 140, and a voltage extractor 150.

The battery pack 120 supplies power to a device, for example, an electric car and electric bicycles, including the battery 110, and include one or more battery modules. In an embodiment, the one or more of the battery modules may be a secondary battery such as a lithium-ion battery. Capacities or voltages of the plurality of battery modules may be identical to or different from each other. The battery 110 may be referred to as an energy storage apparatus.

The battery controller 140 monitors a state or working condition of the battery pack 120, and controls the battery pack 120. The battery controller 140 may refer to a battery management controller or apparatus. In an embodiment, the battery controller 140 performs a thermal control on the one or more of the battery modules included in the battery pack 120. Also, the battery controller 140 controls the one or more of the battery modules to ensure that the one or more of the battery modules do not overcharge or over-discharge, and maintains equalized charge conditions. The battery controller 140, in accordance with an embodiment, thus ensures that energy efficiency of the one or more of the battery modules is improved, and lives of the one or more of the battery modules is prolonged.

In addition, the battery controller 140 estimates state of health (SoH) information, state of charge (SoC) information, and state of function (SoF) information on the one or more of the battery modules. The SoH information indicates a degree of degradation in a performance of the battery pack 120 in comparison to a performance provided in production. The SoC information indicates information on a charge amount of power accommodated in the battery pack 120. The SoF information indicates information on a degree to which the performance of the battery pack 120 matches a predetermined condition.

The battery controller 140 may provide the SoH information, the SoC information, and the SoF information to an electronic control unit (ECU). In an embodiment, the battery controller 140 communicates with the ECU based on a controller area network (CAN) communication.

In the battery pack 120, in one configuration, each of the battery modules is connected in series. For example, a first battery module 121 is connected to a second battery module 122 in series, an upper end of the first battery module 121 indicates an anode, and a lower end of the second battery module 122 indicates a cathode.

The safety plug 130 is disposed between the battery modules to switch a connection between the battery modules. In an embodiment, when a defect occurs in the battery modules, the safety plug 130 blocks the connection between the battery modules. For example, when an overcurrent flows through the first battery module 121 and the second battery module 122, the safety plug 130 switches off the connection between the first battery module 121 and the second battery module 122.

The state of the safety plug 130 may be distinguished between a normal state and an abnormal state. The normal state indicates a state in which the safety plug 130 switches the connection between the battery modules. For example, the normal state includes an "on" state in which the safety plug 130 is connected between the battery modules, and an "off" state in which the safety plug 130 is disconnected between the battery modules. The abnormal state indicates a state in which the safety plug 130 cannot switch on and/or switch off the connection of the battery modules due to an internal defect or malfunction of the safety plug 130 or an external effect. For example, the abnormal state is a state in which the safety plug 130 is shorted to a ground (not shown) or the safety plug 130 is shorted to an external power source.

The voltage extractor 150 outputs a voltage to detect the state of the safety plug 130. The voltage extractor 150 includes distribution elements, and the distribution elements are connected to the safety plug 130. Each of the distribution elements includes a resistor. The voltage extractor 150 applies a test voltage to the distribution elements, and outputs a voltage having a voltage value varying based on the state of the safety plug 130. In an embodiment, the voltage extractor 150 is disposed in the battery pack 120, in the battery controller 140, or outside the battery pack 120 and the battery controller 140. The voltage extractor 150 transmits the voltage based on the detected state of the safety plug 130 to the battery controller 140.

The battery controller 140 includes a voltage receiver (not shown), a state detector (not shown), and a battery module controller (not shown). The voltage receiver receives the voltage to detect the state of the safety plug 130 from the voltage extractor 150. The state detector detects the state of the safety plug 130 based on the voltage received from the voltage extractor 150. The battery module controller controls the one or more of the battery modules based on the detected state of the safety plug 130.

Figure 2:
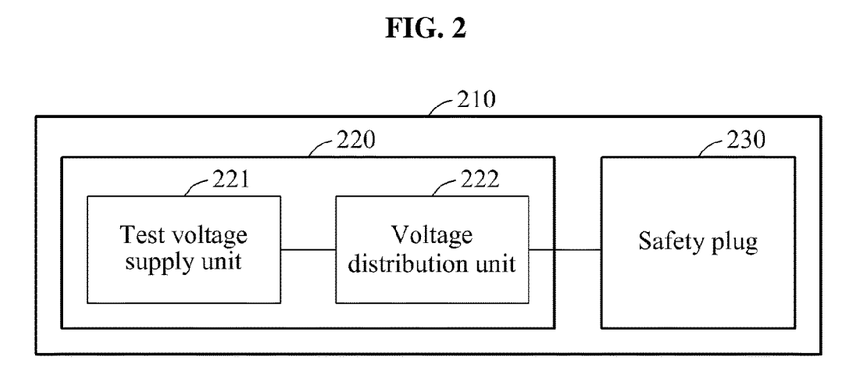
FIG. 2 is a block diagram illustrating an example of an apparatus for detecting a state of a safety plug, in accordance with an embodiment.

FIG. 2 is a block diagram illustrating an example of an apparatus 210 for detecting a state of a safety plug, in accordance with an embodiment. Hereinafter, the apparatus 210 for detecting a state of a safety plug may also be referred to as a detector or as a safety plug state detecting apparatus 210. In one illustrative configuration, the safety plug state detecting apparatus 210 is an integral part of the battery pack 120, or is external to and operatively connected to the battery pack 120 of FIG. 1. In another illustrative configuration, the voltage extractor 220 is an integral part of the voltage extractor 150 and the safety plug 230 corresponds to the safety plug 130 illustrated in FIG. 1.

Referring to FIG. 2, the safety plug state detecting apparatus 210 includes a voltage extractor 220 and a safety plug 230. The voltage extractor 220 includes a test voltage supply unit 221 and a voltage distribution unit 222. The voltage extractor 220 is connected to the safety plug 230. The safety plug 230 is disposed between battery modules included in a battery pack (not shown) to switch a connection between the battery modules. When an overcurrent or an overvoltage occurs in the battery modules, the safety plug 230 may block the connection between the battery modules. Through this, the safety plug 230 is configured to prevent the battery modules from supplying an abnormal amount of current to a device operating threshold including the battery pack (not shown). The device may include, but it is not limited to an automobile, a mobile device, and a display.

The test voltage supply unit 221 supplies the test voltage to the voltage distribution unit 222. The test voltage is a voltage to detect a state of the safety plug 230. In an embodiment, the test voltage supply unit 221 includes a voltage regulator to regulate the test voltage to have a predetermined voltage value. For example, the test voltage supply unit 221 outputs the test voltage using an external power source, for example, a lead storage battery. In this example, when the external power source is a 12 volts (V) direct current (DC) power source, and a 5 V DC is to be supplied to the voltage distribution unit, the test voltage supply unit 221 step-down transforms a voltage output by the external power source from 12 V to 5 V by using the voltage regulator.

The voltage distribution unit 222 includes distribution elements. Each of the distribution elements includes a resistor. The voltage distribution unit 222 is connected to the safety plug 230. For example, the safety plug 230 is connected between the distribution elements. The voltage extractor 220 is disposed in the battery pack (not shown) to connect the voltage distribution unit 222 with the safety plug 230, or is disposed outside the battery pack to connect the voltage distribution unit 222 with the safety plug 230. The test voltage supply unit 221 supplies the test voltage to each of the distribution elements in the voltage distribution unit 222, and a voltage having a voltage value varying based on the state of the safety plug 230 is applied to each of the distribution elements.

In an embodiment, the voltage distribution unit 222 includes a first resistor, a second resistor, and a third resistor. The first resistor, the second resistor, and the third resistor are sequentially connected in series, and the safety plug 230 is connected between the second resistor and the third resistor. When the test voltage supply unit 221 applies the test voltage to the first resistor, the second resistor, and the third resistor, the test voltage is distributed to the first resistor, the second resistor, and the third resistor. The voltage output unit 220 outputs a voltage detected between the first resistor and the second resistor. In this example, the output voltage is a voltage value that varies based on the state of the safety plug 230. For example, the voltage value of the voltage output by the voltage output unit 220 varies based on an "on" state in which the safety plug 230 is connected between the battery modules, an "off" state in which the safety plug 230 is disconnected between the battery modules, a state in which the safety plug 230 is shorted to a ground, and a state in which the safety plug 230 is shorted to the external power source.

Figure 3:
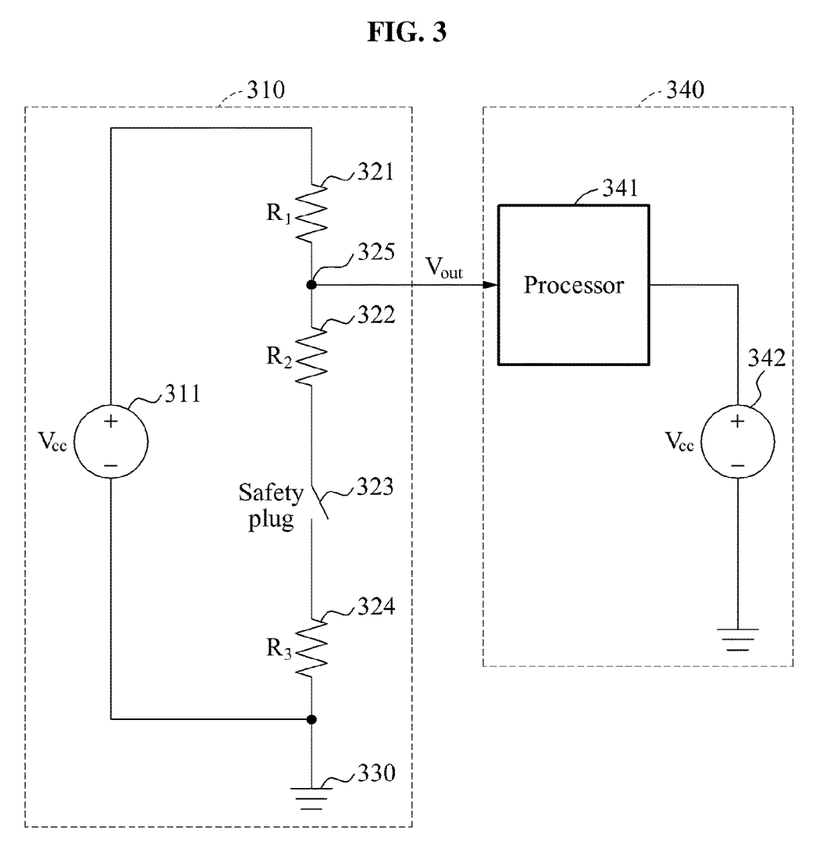
FIG. 3 is a diagram illustrating an example of a voltage output generated based on a state of a safety plug, in accordance with an embodiment.

FIG. 3 is a diagram illustrating an example of a voltage output generated based on a state of a safety plug 323, in accordance with an embodiment.

Referring to FIG. 3, a voltage output unit 310 includes a voltage source 311, a first resistor 321, a second resistor 322, the safety plug 323, a third resistor 324, and a ground 330. In one illustrative configuration, the voltage output unit 310 is part of the voltage extractor 150 illustrated in FIG. 1 and the battery controller 340 is shown as the battery controller 140 of FIG. 1.

The first resistor 321, the second resistor 322, and the third resistor 324 are operatively connected in series, and safety plug 323 is connected between the second resistor 322 and the third resistor 324. The voltage source 311 and the third resistor 324 are connected to the ground 330. Although not shown in FIG. 3, the safety plug 323 is disposed between battery modules to switch a connection between the battery modules.

The battery controller 340 includes a processor 341 and a voltage source 342. The processor 341 controls the voltage output unit 310 and the battery modules.

The voltage source 311 supplies a test voltage to the first resistor 321, the second resistor 322, and the third resistor 324. In an embodiment, the voltage source 311 supplies the test voltage by adjusting a voltage output by an external power source using a voltage regulator. For example, the processor 341 receives a voltage between 0 V and 5 V, and the voltage source 342 supplies a 5 V voltage to the processor 341. The voltage source 311 adjusts the voltage output by the external power source to be the 5 V voltage so as to be supplied from the voltage source 342 to the processor 341 using the voltage regulator, thereby supplying the 5 V voltage to the first resistor 321, the second resistor 322, and the third resistor 324. As a result, the voltage output unit 310 supplies a voltage less than 5 V to the processor 341, and prevents the processor 341 from receiving an overvoltage.

When the voltage source 311 applies the test voltage to the first resistor 321, the second resistor 322, and the third resistor 324, the test voltage is distributed to the first resistor 321, the second resistor 322, and the third resistor 324. The voltage output unit 310 supplies a voltage detected between the first resistor 321 and the second resistor 322 through a junction 325 between the first resistor 321 and the second resistor 322. In this example, the voltage transmitted to the processor 341 has a voltage value that varies based on the state of the safety plug 323.

The processor 341 may receive the voltage from the voltage output unit 310, and detect the state of the safety plug 323 based on the receive voltage. In an embodiment, the processor 341 detects the state of the safety plug 323 by comparing the received voltage to predetermined reference information. The predetermined reference information may include information on the state to which a voltage value of the received voltage is mapped. For example, the processor 341 may include a lookup table storing the information on the state to which a voltage value of the received voltage is mapped. The processor 341 searches the lookup table based on the voltage value of the received voltage to detect information on the state of the safety plug 323.

The processor 341 controls the battery modules based on the detected state of the safety plug 323. For example, when an abnormal state of the safety plug 323 is detected, the processor 341 prevents the battery modules from supplying power to a device including the battery modules.

In an embodiment, the processor 341 controls the voltage output unit 310 based on an operation mode. The operation mode includes a safety plug state detecting mode and a normal mode. When the operation node is the safety plug state detecting mode, the processor 341 transmits to the voltage output unit 310 a control signal to apply the test voltage to the first resistor 321, the second resistor 322, and the third resistor 323. The voltage output unit 310 controls the voltage source 311 in response to the control signal, and applies the test voltage to the first resistor 321, the second resistor 322, and the third resistor 324. When the test voltage is applied, the voltage output unit 310 transmits a voltage to the processor 341, and the processor 341 detects the state of the safety plug 323 based on the voltage received from the voltage output unit 310. When the operation mode is the normal mode, the processor 341 transmits to the voltage output unit 310 a control signal to suspend a supply of the test voltage. The voltage output unit 310 controls the voltage source 311 in response to the control signal, and blocks the supply of the test voltage to the first resistor 321, the second resistor 322, and the third resistor 324.

Figure 4:
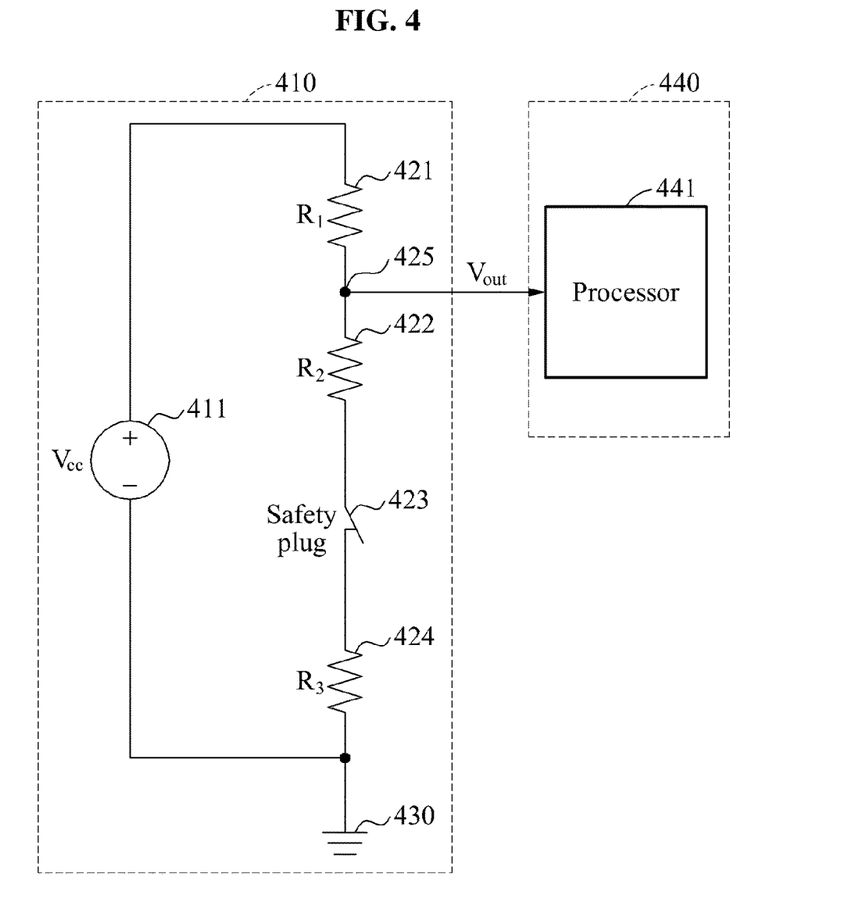
FIG. 4 is a diagram illustrating an example of a first condition of a safety plug, in accordance with an embodiment.

FIG. 4 is a diagram illustrating an example of a first condition of a safety plug 423, in accordance with an embodiment.

Referring to FIG. 4, a voltage output unit 410 includes a voltage source 411, a first resistor 421, a second resistor 422, the safety plug 423, a third resistor 424, and a ground 430. The first resistor 421, the second resistor 422, and the third resistor 424 are operatively connected in series, and the safety plug 423 is operatively connected between the second resistor 422 and the third resistor 424. The voltage source 411 and the third resistor 424 are connected to the ground 430. The safety plug 423 is disposed between battery modules to switch a connection between the battery modules.

In one illustrative configuration, the voltage output unit 410 is part of the voltage extractor 150 illustrated in FIG. 1 and the battery controller 440 is shown as the battery controller 140 of FIG. 1.

A processor 441 included in a battery controller 440 may control the voltage output unit 410.

The voltage source 411 supplies a test voltage to the first resistor 421, the second resistor 422, and the third resistor 424. When the safety plug 423 is in an "on" state in which the safety plug 423 is connected between the battery modules, the second resistor 422 and the third resistor 423 are connected in series. Thus, the test voltage is distributed to the first resistor 421, the second resistor 422, and the third resistor 424. The voltage output unit 410 transmits to the processor 441 a voltage detected between the first resistor 421 and the second resistor 422, through a junction 425 between the first resistor 421 and the second resistor 422.

The voltage transmitted from the voltage output unit 410 to the processor 441 is obtained using Equation 1.

$$V_{out} = V_{cc} \times \frac{R_2 + R_3}{R_1 + R_2 + R_3} \quad \text{[Equation 1]}$$

In Equation 1, $V_{out}$ denotes the voltage transmitted from the voltage output unit 410 to the processor 441, $V_{cc}$ denotes the test voltage, $R_1$ denotes a resistance of the first resistor 421, $R_2$ denotes a resistance of the second resistor 422, and $R_3$ denotes a resistance of the third resistor 424. The voltage transmitted from the voltage output unit 410 to the processor 441 is a voltage across the second resistor 422 and the third resistor 423 as a function of the test voltage.

The processor 441 detects the "on" state in which the safety plug 423 is connected between the battery modules based on the voltage received from the voltage output unit 410.

Figure 5:
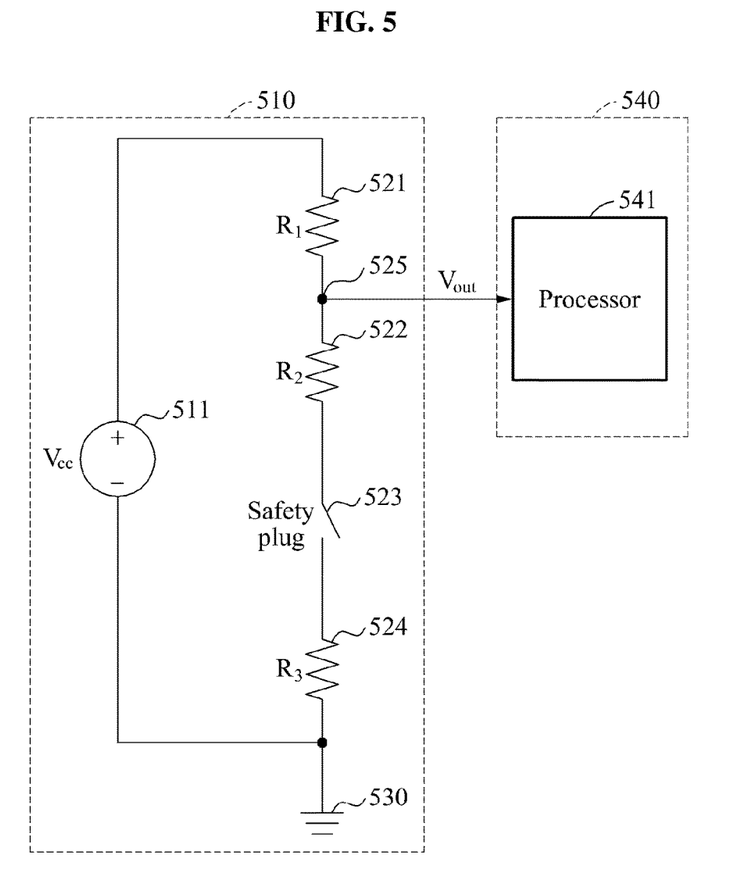
FIG. 5 is a diagram illustrating an example of a second condition of a safety plug, in accordance with an embodiment.

FIG. 5 is a diagram illustrating an example of a second condition of a safety plug 523, in accordance with an embodiment.

Referring to FIG. 5, a voltage output unit 510 includes a voltage source 511, a first resistor 521, a second resistor 522, the safety plug 523, a third resistor 524, and a ground 530. The first resistor 521, the second resistor 522, the safety plug 523, and the third resistor 524 are sequentially operatively connected in series. The voltage source 511 and the third resistor 524 are connected to the ground 530. The voltage source 511, the first resistor 521, the second resistor 522, the safety plug 523, and the third resistor 524 configure a closed loop.

In one illustrative configuration, the voltage output unit 510 is part of the voltage extractor 150 illustrated in FIG. 1 and a battery controller 540 is shown as the battery controller 140 of FIG. 1.

A processor 541 included in the battery controller 540 controls the voltage output unit 510.

The voltage source 511 supplies a test voltage to the first resistor 521, the second resistor 522, and the third resistor 524. When the safety plug 523 is in an "off" state in which the safety plug 523 is disconnected between the plurality of battery modules, a connection between the second resistor 522 and the third resistor 523 is switched off. Thus, the voltage source 511, the first resistor 521, the second resistor 522, the safety plug 523, and the third resistor 524 do not configure the closed loop, and the test voltage is not applied to the first resistor 521, the second resistor 522, and the third resistor 524. When the test voltage is not applied to the first resistor 521, the second resistor 522, and the third resistor 524, the test voltage is detected at a junction 525 between the first resistor 521 and the second resistor 522. The voltage output unit 510 transmits the test voltage to the processor 541 through the junction 525. The processor 541 detects the "off" state in which the safety plug 523 is disconnected between the battery modules based on the voltage received from the voltage output unit 510.

Figure 6:
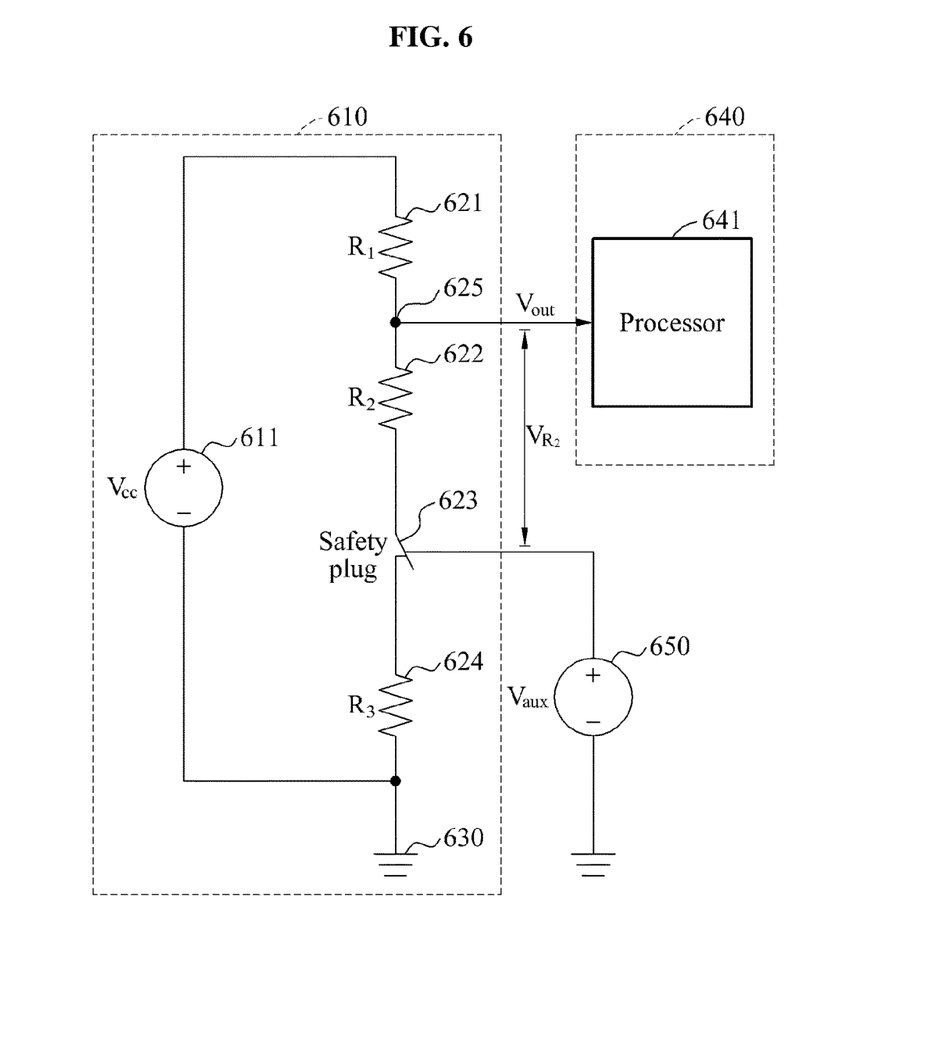
FIG. 6 is a diagram illustrating an example of a third condition of a safety plug, in accordance with an embodiment.

FIG. 6 is a diagram illustrating an example of a third condition of a safety plug 623, in accordance with an embodiment.

Referring to FIG. 6, a voltage output unit 610 includes a voltage source 611, a first resistor 621, a second resistor 622, the safety plug 623, a third resistor 624, and a ground 630. The first resistor 621, the second resistor 622, the safety plug 623, and the third resistor 624 are sequentially operatively connected in series. The voltage source 611 and the third resistor 624 are operatively connected to the ground 630.

A processor 641 included in a battery controller 640 controls the voltage output unit 610.

In one illustrative configuration, the voltage output unit 610 is part of the voltage extractor 150 illustrated in FIG. 1 and the battery controller 640 is shown as the battery controller 140 of FIG. 1.

The voltage source 611 supplies a test voltage to the first resistor 621, the second resistor 622, and the third resistor 624. When the safety plug 623 is in a state in which the safety plug 623 is shorted to an external power source 650, the second resistor 622 is connected to the external power source 650. Thus, a closed loop is configured including the voltage source 611, the first resistor 621, the second resistor 622, the safety plug 623, and the external power source 650. Also, a closed loop is configured including the third resistor 624 and the external power source 650. Accordingly, a voltage supplied by the external power source 650 is applied to the third resistor 624, in lieu of the test voltage.

The voltage output unit 610 transmits to the processor 541 a voltage detected between the first resistor 621 and the second resistor 622 through a junction 625 between the first resistor 621 and the second resistor 622. The voltage detected between the first resistor 621 and the second resistor 622 indicates a voltage supplied from the external power source 650 and a voltage 626 applied to both ends of the second resistor 622 in the test voltage.

The voltage transmitted from the voltage output unit 610 to the processor 641 is obtained using Equation 2.

$$V_{out} = V_{cc} \times \frac{R_2}{R_1 + R_2} + V_{aux} \times \frac{R_1}{R_1 + R_2} \quad \text{[Equation 2]}$$

In Equation 2, $V_{out}$ denotes the voltage transmitted from the voltage output unit 610 to the processor 641, $V_{cc}$ denotes the test voltage, $V_{aux}$ denotes the voltage supplied by the external power source 650, $R_1$ denotes a resistance of the first resistor 621, $R_2$ denotes a resistance of the second resistor 622, and $R_3$ denotes a resistance of the third resistor 624.

The processor 641 detects the state in which the safety plug 623 is shorted to the external power source 650 based on the voltage received from the voltage output unit 610.

Figure 7:
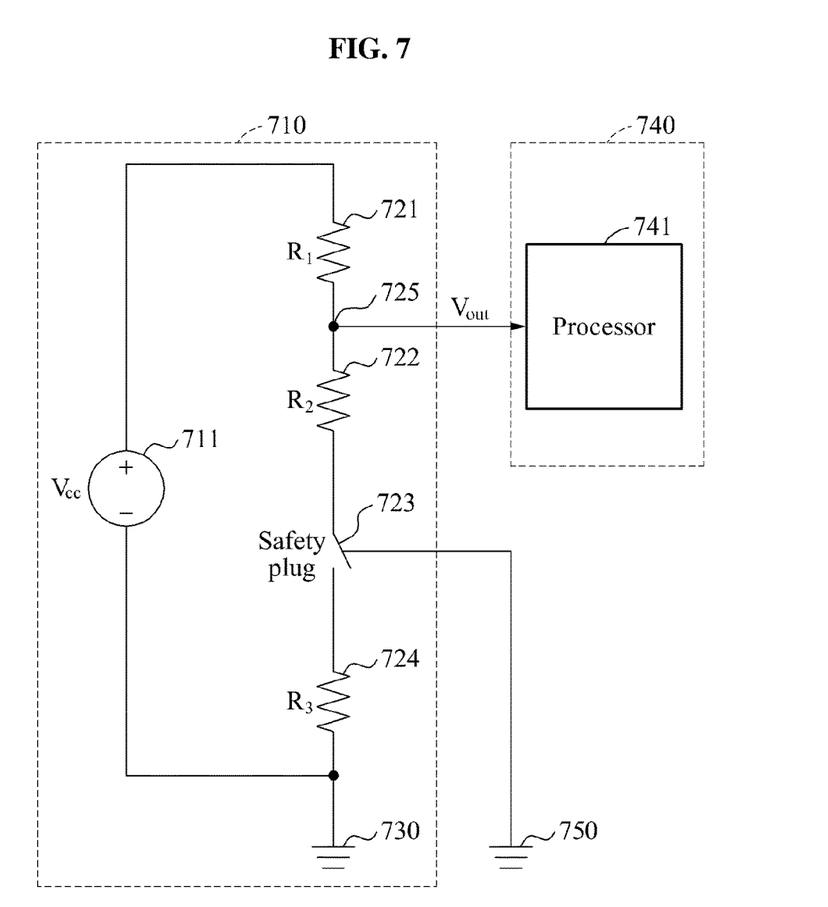
FIG. 7 is a diagram illustrating an example of a fourth condition of a safety plug, in accordance with an embodiment.

FIG. 7 is a diagram illustrating an example of a fourth condition of a safety plug 723, in accordance with an embodiment.

Referring to FIG. 7, a voltage output unit 710 includes a voltage source 711, a first resistor 721, a second resistor 722, the safety plug 723, a third resistor 724, and a ground 730. The first resistor 721, the second resistor 722, the safety plug 723, and the third resistor 724 are sequentially operatively connected in series. The voltage source 711 and the third resistor 724 are connected to the ground 730. The voltage source 711, the first resistor 721, the second resistor 722, the safety plug 723, and the third resistor 724 form a closed loop configuration.

In one illustrative configuration, the voltage output unit 710 is part of the voltage extractor 150 illustrated in FIG. 1 and a battery controller 740 is shown as the battery controller 140 of FIG. 1.

The voltage source 711 may supply a test voltage to the first resistor 721, the second resistor 722, and the third resistor 724. When the safety plug 723 is in a state in which the safety plug 723 is shorted to a ground 750, the second resistor 722 may be connected to the ground 750. Thus, a closed loop including the voltage source 711, the first resistor 721, the second resistor 722, and the safety plug 723 may be configured and the test voltage may not be applied to the third resistor 724. Accordingly, the test voltage may be applied to the first resistor 721 and the second resistor 722.

The voltage output unit 710 transmits to the processor 741 included in the battery controller 740, a voltage detected between the first resistor 721 and the second resistor 722 through a junction 725 between the first resistor 721 and the second resistor 722. The voltage detected between the first resistor 721 and the second resistor 722 indicates a voltage applied to the second resistor 722 in the test voltage.

The voltage transmitted from the voltage output unit 710 to the processor 741 is obtained using Equation 3.

$$V_{out} = V_{cc} \times \frac{R_2}{R_1 + R_2} \quad \text{[Equation 3]}$$

In Equation 3, $V_{out}$ denotes the voltage transmitted from the voltage output unit 710 to the processor 741, $V_{cc}$ denotes the test voltage, $R_1$ denotes a capacity of the first resistor 721, and $R_2$ denotes a capacity of the second resistor 722.

The processor 741 detects the state in which the safety plug 723 is shorted to the ground 750 based on the voltage received from the voltage output unit 710.

Figure 8:
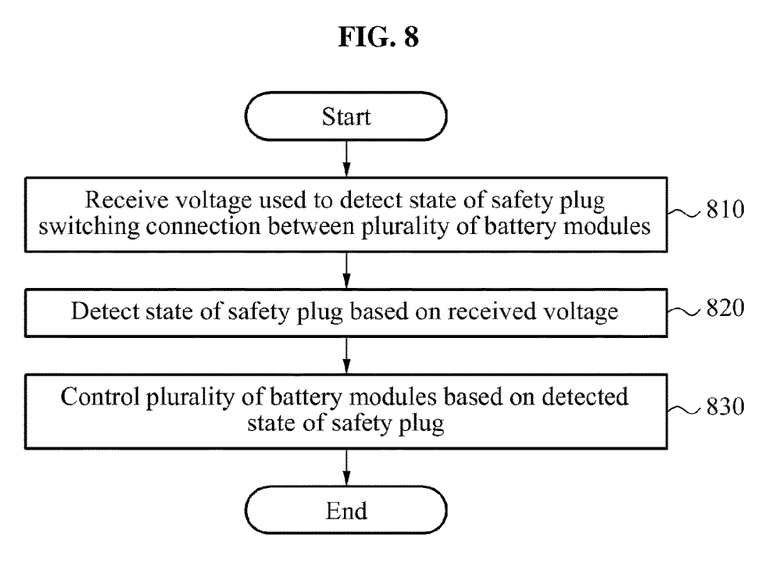
FIG. 8 is a flowchart illustrating an example of a method to control a battery control apparatus, in accordance with an embodiment.

FIG. 8 is a flowchart illustrating an example of a method to control a battery control apparatus, in accordance with an embodiment.

Referring to FIG. 8, in operation 810, the method, through the battery control apparatus, receives a voltage having a voltage value varying based on a state of a safety plug used to switch a connection between a plurality of battery modules.

In operation 820, the method, through the battery control apparatus, detects the state of the safety plug based on the received voltage.

In operation 830, the method, through the battery control apparatus, controls the battery modules based on the detected state of the safety plug.

Descriptions provided with reference to FIGS. 1 through 7 may be directly applied to the method of controlling the battery control apparatus of FIG. 8 and thus, repeated descriptions will be omitted for increased clarity and conciseness.

It is to be understood that in the embodiment of the present invention, the operations in FIG. 8 are performed in the sequence and manner as shown although the order of some operations and the like may be changed without departing from the spirit and scope of the described configurations. In accordance with an illustrative example, a computer program embodied on a non-transitory computer-readable medium may also be provided, encoding instructions to perform at least the method described in FIG. 8.

Program instructions to perform a method described in FIG. 8, or one or more operations thereof, may be recorded, stored, or fixed in one or more computer-readable storage media. The program instructions may be implemented by a computer. For example, the computer may cause a processor to execute the program instructions. The media may include, alone or in combination with the program instructions, data files, data structures, and the like. Examples of computer-readable media include magnetic media, such as hard disks, floppy disks, and magnetic tape; optical media such as CD ROM disks and DVDs; magneto-optical media, such as optical disks; and hardware devices that are specially configured to store and perform program instructions, such as read-only memory (ROM), random access memory (RAM), flash memory, and the like. Examples of program instructions include machine code, such as produced by a compiler, and files containing higher level code that may be executed by the computer using an interpreter. The program instructions, that is, software, may be distributed over network coupled computer systems so that the software is stored and executed in a distributed fashion. For example, the software and data may be stored by one or more computer readable recording mediums. Also, functional programs, codes, and code segments for accomplishing the example embodiments disclosed herein may be easily construed by programmers skilled in the art to which the embodiments pertain based on and using the flow diagrams and block diagrams of the figures and their corresponding descriptions as provided herein.

The units and apparatuses described herein may be implemented using hardware components. The hardware components may include, for example, controllers, sensors, processors, generators, drivers, and other equivalent electronic components. The hardware components may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The hardware components may run an operating system (OS) and one or more software applications that run on the OS. The hardware components also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a hardware component may include multiple processors or a processor and a controller. In addition, different processing configurations are possible, such a parallel processors.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. An apparatus to detect a state of a safety plug, the apparatus comprising:
a safety plug configured to switch a connection between battery modules; and
a voltage output unit configured to apply a test voltage to distribution elements operatively connected to the safety plug, and output a single output voltage varying based on an "on" state in which the safety plug is connected between the battery modules, an "off" state in which the safety plug is disconnected between the battery modules, a state in which the safety plug is shorted to a ground, and a state in which the safety plug is shorted to an external power source,
wherein the distribution elements comprise a first resistor, a second resistor, and a third resistor,
wherein the voltage output unit comprises a voltage source directly connected to the first resistor and the third resistor, and
wherein the single output voltage is calculated based on the test voltage, the first resistor, the second resistor and the third resistor in response to the state of the safety plug.

2. The apparatus of claim 1, wherein the voltage output unit comprises a test voltage supply unit configured to supply the test voltage to the distribution elements.

3. The apparatus of claim 2, wherein the test voltage supply unit is configured to use a voltage regulator to adjust the test voltage to be in a voltage range.

4. The apparatus of claim 1, wherein the test voltage is input to a battery control device used to control the battery modules.

5. The apparatus of claim 1, wherein the first resistor, the second resistor, and the third resistor are operatively connected in series, and
the safety plug is connected between the second resistor and the third resistor.

6. The apparatus of claim 1, wherein when the safety plug is in the "on" state, in which the safety plug is connected between the battery modules, the second resistor is connected to the third resistor in series, and
the voltage output unit is configured to output a voltage across the second resistor and the third resistor as a function of the test voltage.

7. The apparatus of claim 5, wherein when the safety plug is in the "off" state, in which the safety plug is disconnected between the battery modules, a connection between the second resistor and the third resistor is switched off, and the voltage output unit is configured to output the test voltage.

8. The apparatus of claim 5, wherein when the safety plug is shorted to the external power source, the second resistor is connected to the external power source, and the voltage output unit is configured to output, as a function of the test voltage, a voltage applied to both ends of the second resistor and a voltage supplied from the external power source.

9. The apparatus of claim 5, wherein when the safety plug is shorted to the ground, the second resistor is connected to the ground, and the voltage output unit is configured to output a voltage applied to the second resistor as a function of the test voltage.

10. The apparatus of claim 5, wherein the single output voltage is detected between the first resistor and the second resistor.

11. A battery control apparatus, comprising:

a voltage receiver configured to receive a single output voltage varying based on a state of a safety plug switching a connection between battery modules from a voltage output unit;

a condition detector configured to detect the state of the safety plug based on the received single output voltage; and a battery module controller configured to control the battery modules based on the detected state of the safety plug, wherein the voltage output unit is configured to apply a test voltage to distribution elements operatively connected to the safety plug, wherein the distribution elements comprise a first resistor, a second resistor, and a third resistor, wherein the voltage output unit comprises a voltage source directly connected to the first resistor and the third resistor, and wherein the single output voltage is calculated based on the test voltage, the first resistor, the second resistor and the third resistor in response to the state of the safety plug.

12. The battery control apparatus of claim 11, wherein the condition detector is configured to detect the state of the safety plug by comparing the received single output voltage to reference information, and the reference information comprises information on the state to which the received single output voltage is mapped.

13. A battery, comprising:

battery modules;

a safety plug configured to switch a connection between the battery modules;

a voltage output unit configured to apply a test voltage to distribution elements operatively connected to the safety plug, and output a single output voltage varying based on an "on" state in which the safety plug is connected between the battery modules, an "off" state in which the safety plug is disconnected between the battery modules, a state in which the safety plug is shorted to a ground, and a state in which the safety plug is shorted to an external power source; and a controller configured to detect the state of the safety plug based on the single output voltage from the voltage output unit, wherein the distribution elements comprises a first resistor, a second resistor, and a third resistor, wherein the voltage output unit comprises a voltage source directly connected to the first resistor and the third resistor, and wherein the single output voltage is calculated based on the test voltage, the first resistor, the second resistor and the third resistor in response to the state of the safety plug.

14. The battery of claim 13, wherein the first resistor, the second resistor, and the third resistor are connected in series, and the safety plug is connected between the second resistor and the third resistor.

15. The battery of claim 14, wherein the voltage output unit is configured to provide, to the controller, a single output voltage detected between the first resistor and the second resistor.

16. The battery of claim 13, wherein the controller is configured to control the battery modules based on the detected state of the safety plug.

17. The battery of claim 13, wherein the voltage output unit comprises a test voltage supply unit configured to supply the test voltage to the distribution elements.

18. The battery of claim 13, wherein the safety plug is configured to prevent the battery modules from supplying an amount of current in excess of a device operating threshold, wherein the device comprises at least one of an automobile, a mobile device, and a display.

* * * * *